United States Patent
Yap et al.

(10) Patent No.: US 9,589,909 B1
(45) Date of Patent: Mar. 7, 2017

(54) RADIO FREQUENCY AND ELECTROMAGNETIC INTERFERENCE SHIELDING IN WAFER LEVEL PACKAGING USING REDISTRIBUTION LAYERS

(71) Applicant: FREESCALE SEMICONDUCTOR, INC., Austin, TX (US)

(72) Inventors: Weng F. Yap, Chandler, AZ (US); Eduard J. Pabst, Mesa, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/922,051

(22) Filed: Oct. 23, 2015

(51) Int. Cl.
*H01L 23/552* (2006.01)
*H01L 23/498* (2006.01)

(52) U.S. Cl.
CPC ...... *H01L 23/552* (2013.01); *H01L 23/49816* (2013.01); *H01L 23/49822* (2013.01)

(58) Field of Classification Search
None
See application file for complete search history.

(56) References Cited

U.S. PATENT DOCUMENTS

| | | |
|---|---|---|
| 7,528,069 B2 | 5/2009 | Wenzel et al. |
| 2010/0078778 A1* | 4/2010 | Barth .............. H01L 21/568 257/659 |
| 2014/0070415 A1 | 3/2014 | Vincent et al. |
| 2015/0001689 A1 | 1/2015 | Goetz et al. |

* cited by examiner

*Primary Examiner* — Reema Patel (57) ABSTRACT

Radio frequency/electromagnetic interference (RF/EMI) shielding within redistribution layers of a fan-out wafer level package is provided. By using RDL metal layers to provide the shielding, additional process steps are avoided (e.g., incorporating a shielding lid or applying conformal paint on the package back side). Embodiments use metal filled trench vias in the RDL dielectric layers to provide metal "walls" around the RF sensitive signal lines through the dielectric layer regions of the RDL. These walls are coupled to ground, which isolates the signal lines from interference or noise generated outside the walls.

12 Claims, 5 Drawing Sheets

RADIO FREQUENCY AND ELECTROMAGNETIC INTERFERENCE SHIELDING IN WAFER LEVEL PACKAGING USING REDISTRIBUTION LAYERS

BACKGROUND

Field

This disclosure relates generally to wafer level packaging, and more specifically, to shielding signal lines in a redistribution layer of a wafer level package by using other metal layers.

Related Art

As wireless connectivity is expanded to more devices and the sizes of those devices are reduced, radio frequency (RF) devices are placed closer to digital and baseband packages. Digital and baseband packages can generate electromagnetic noise and interference that can disrupt or impair operation of RF systems. Digital circuitry and the power supplies for such circuitry can operate at frequencies of 500 MHz to 3 gigahertz. A single digital chip can have millions of switches operating at those frequencies and generating noise at those frequencies and harmonics of those frequencies. These frequencies can be close to the radio frequencies used by electronic systems for wireless communications. As a result, antennas, filters, multiplexers, modulators, up and down converters, and amplifiers or gain stages can all be impacted by the noise generated by a nearby digital chip.

As a result, RF devices (e.g., an RF modem) is typically shielded by a metal case that covers the RF device to avoid interference from the digital and baseband circuitry. But shielding the chip may not avoid RF signals transmitted through conductors in package interconnect redistribution layers (RDL) being affected by noise and interference transmitted in nearby RDL conductors or other nearby chips or packages.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide radio frequency/electromagnetic interference (RF/EMI) shielding within redistribution layers of a fan-out wafer level package. By using RDL metal layers to provide the shielding, additional process steps are avoided (e.g., incorporating a shielding lid or applying conformal paint on the package back side). Embodiments use metal filled trench vias in the RDL dielectric layers to provide metal "walls" around the RF sensitive signal lines through the dielectric layer regions of the RDL. These walls are coupled to ground, which isolates the signal lines from interference or noise generated outside the walls.

Figure 1:
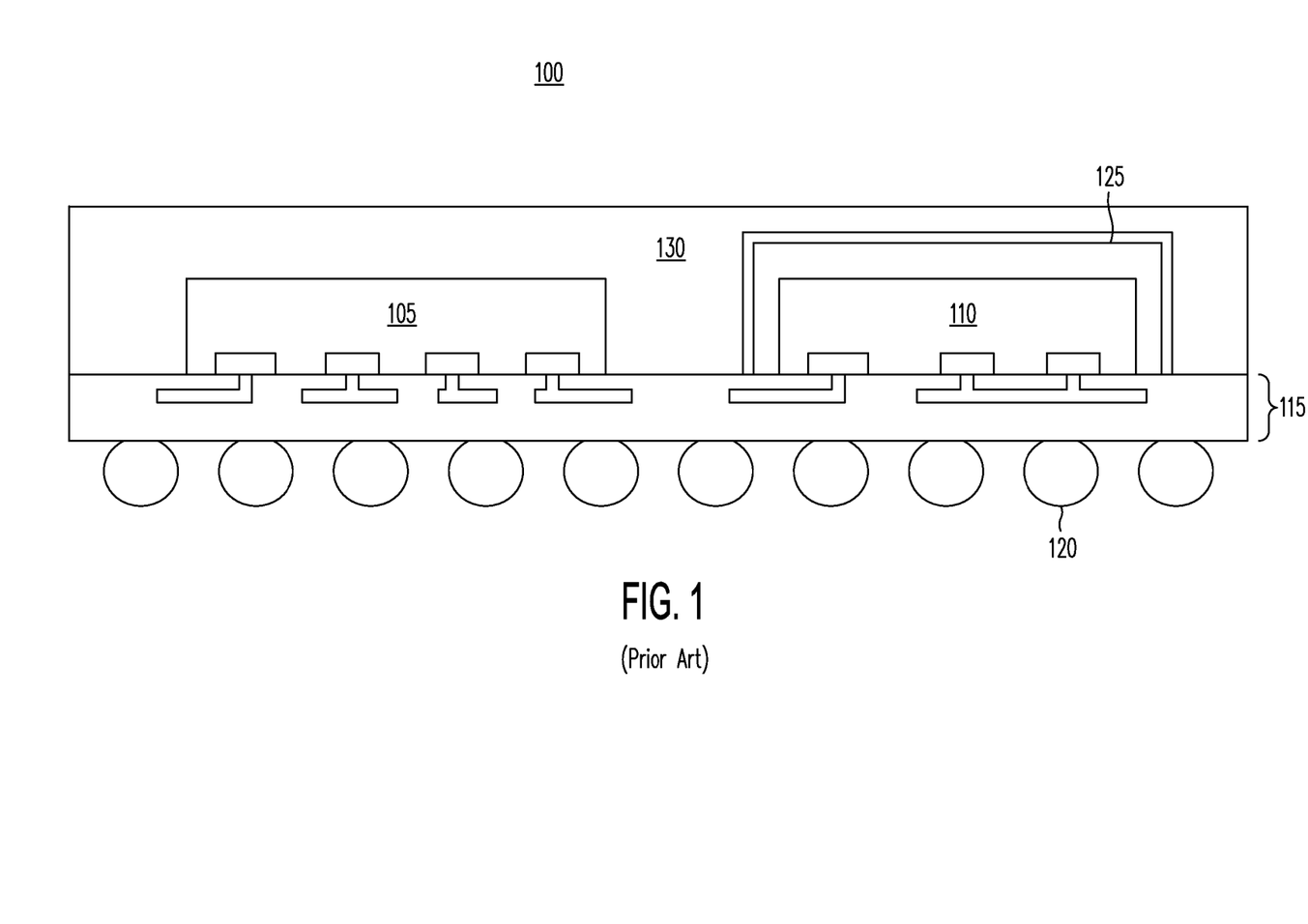
FIG. 1 is a simplified block diagram illustrating a semiconductor device package 100 incorporating two dies in a side-by-side configuration, as provided in typical RF device packages.

FIG. 1 is a simplified block diagram illustrating a semiconductor device package 100 incorporating two dies in a side-by-side configuration, as provided in typical RF device packages. A redistribution layer 115 supports two dies 105 and 110. The redistribution layer provides connections from the dies to external connections, such as a ball grid array 120. Die 110 is illustrated as being covered by an isolation cap 125. In alternative arrangements, both dies can be covered by isolation layers. The package is encapsulated using a molding compound 130.

Alternative prior art embodiments can include different arrangements of the dies, and different types of covers for the dies or the package. These covers are intended to prevent RF noise or EMI from affecting the covered dies. But conductor lines within redistribution layer 115 can still transmit and receive RF noise and EMI, which can affect the operation of the devices in the package. There is a need to isolate RF signal lines associated with RF devices from other RDL lines to reduce or eliminate this noise and interference.

Figure 2A:
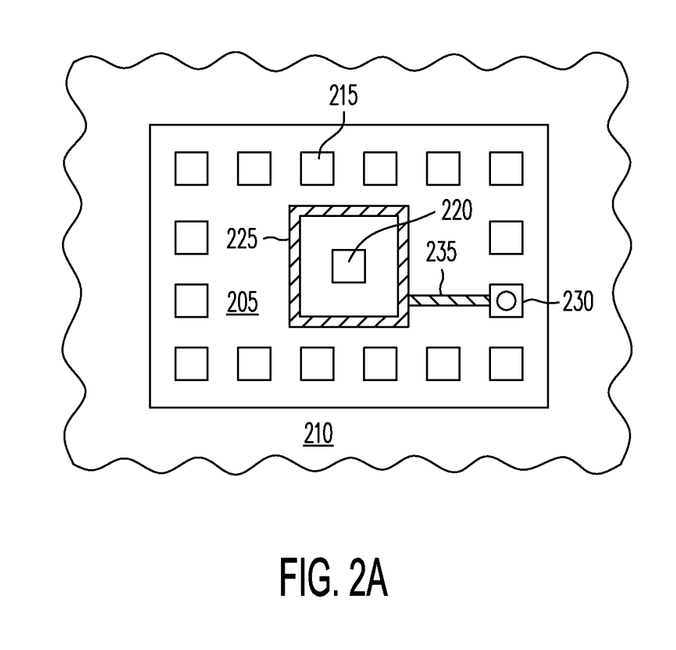
FIG. 2A is a simplified block diagram illustrating a plan view of a fan-out wafer level package (FO-WLP) incorporating a redistribution layer configured to isolate an RF signal line, in accord with embodiments of the present invention.

FIG. 2A is a simplified block diagram illustrating a plan view of a fan-out wafer level package (FO-WLP) incorporating a redistribution layer configured to isolate an RF signal line, in accord with embodiments of the present invention. As illustrated, a semiconductor device die 205 is provided in an encapsulant 210. Device die 205 includes a set of bond pads 215 on a perimeter of a major surface of the die. The device die further incorporates an RF signal bond pad 220 in a middle area of the major surface. A set of redistribution layers is formed on the encapsulated die and encapsulant.

The redistribution layers are typically a set of insulating layers interspersed with a set of patterned conductive metal layers. An insulating layer can be made from organic polymers, for example, in liquid or dry film and can include a wide range of other materials used for interlayer dielectrics as known in the art (e.g., silicon dioxide, silicon nitride, silicon oxynitride, or any combination of such layers providing electrical isolation). The insulating layer can be patterned to expose bonding pads, conductors formed below the insulating layer, or have through vias formed therein.

A conductive layer can then be deposited on an insulating layer to provide an interconnect to exposed lower level metals or through vias. Conductive layers can include materials such as metal, metal alloy, doped semiconductor, semi-metals, or combinations thereof as known in the art (e.g., amorphous silicon, doped polysilicon, aluminum, copper, tantalum, titanium, tungsten, or any metal alloy, nitride or silicide). Through the use of a conductive layer, any number of bonding pads can be interconnected in any combination to the same or other die. The interconnects illustrated in the various figures are provided only by way of example, and it should be realized that the interconnects formed by the conductive layers discussed below can extend not only across the page as illustrated but also into and above the page.

One embodiment of the present invention forms an isolating wall 225 in the redistribution layers (RDL) of the FO-WLP around the region of RF signal bond pad 220. As will be discussed in greater detail below, isolating wall 225 is formed using a combination of portions of RDL metal layers and metal-filled trench vias in the package RDL. The metal-filled trench vias provide shielding through dielectric layers of the package RDL. In this manner, a signal line connected to RF signal bond pad 220 can be isolated throughout the thickness of the RDL, from the bond pad to a solder ball at the surface of the package. Isolating wall 225 can be coupled to a ground bond pad 230 on device die 205 by a metal line 235.

Figure 2B:
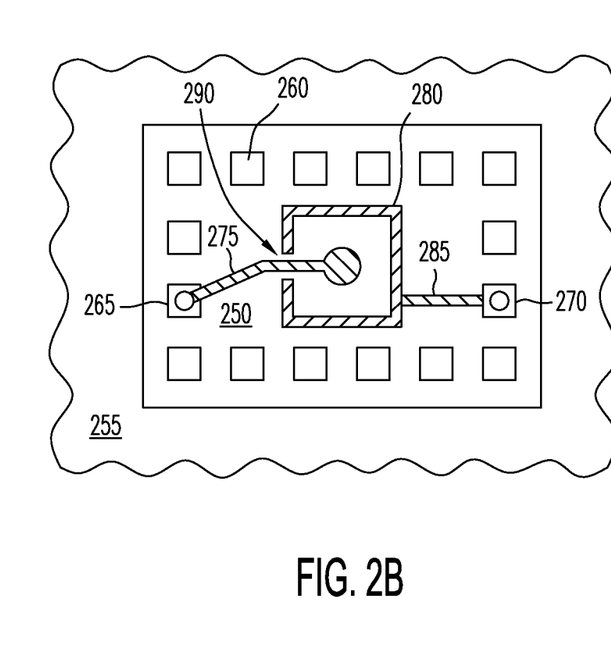
FIG. 2B is a simplified block diagram illustrating a plan view of an alternative FO-WLP incorporating a RDL configured to isolate an RF signal line, in accord with embodiments of the present invention.

FIG. 2B is a simplified block diagram illustrating a plan view of an alternative FO-WLP incorporating a RDL configured to isolate an RF signal line, in accord with embodiments of the present invention. As illustrated, a semiconductor device die 250 is provided in an encapsulant 255. Device die 250 includes a set of bond pads 260 on a perimeter of a major surface of the die. The device die includes an RF signal bond pad 265 as one of the perimeter bond pads.

One embodiment of the present invention forms an isolating wall 280 in an area of available volume within the package RDL. Again, isolating wall 280 is formed using metal-filled trench vias. A signal line 275 connected to RF signal bond pad 265 can be brought into the isolating wall through a gap 290 and then routed up through the thickness of the RDL, to a solder ball at the surface of the package. As with FIG. 2A, isolating wall 280 can be coupled to a ground bond pad 270 on device die 250 by a metal line 285.

Figure 3:
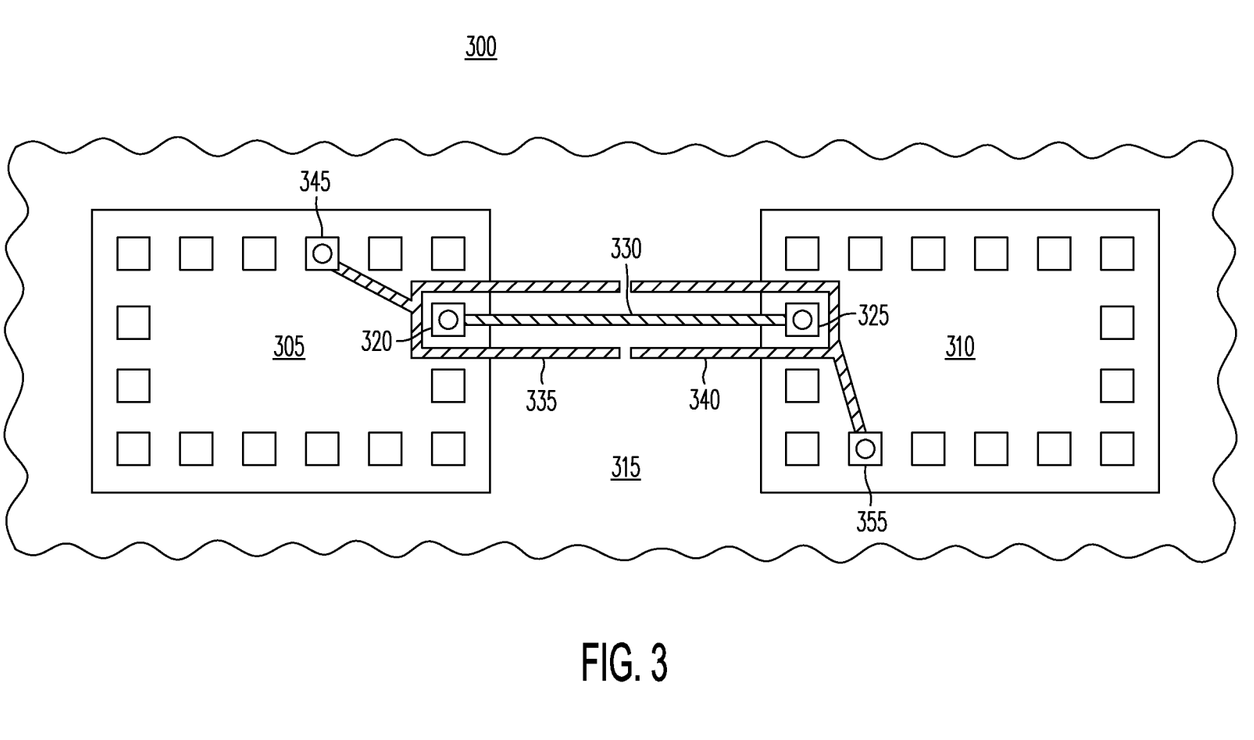
FIG. 3 is a simplified block diagram illustrating a plan view of an alternative FO-WLP incorporating a RDL configured to isolate an RF signal line passing between two die provided in the package, in accord with embodiments of the present invention.

FIG. 3 is a simplified block diagram illustrating a plan view of an alternative FO-WLP incorporating a RDL configured to isolate an RF signal line passing between two die provided in the package, in accord with embodiments of the present invention. Package 300 includes two die 305 and 310 in an encapsulant 315. A communication bond pad 320 on die 305 is coupled to communication bond pad 325 on die 310 by a signal line 330.

Since signal line 330 is coupled to device die that are sensitive to RF noise or interference, or can generate RF noise or interference, it is desirable to form an isolating wall along the length and height of the signal line. As illustrated, the isolating wall includes a metal region 335 formed within the package RDL and coupled to a ground bond pad 345 on die 305. The isolating wall also includes a metal region 340 formed within the package RDL and coupled to a ground bond pad 355 on die 310. Alternative arrangements can provide a single metal region along the length of signal line 330. The metal region is illustrated along the sides of signal line 330, but it should be understood that electrical isolation is accomplished by surrounding signal line 330 not only along the sides, but also above and below the signal line.

Figure 4:
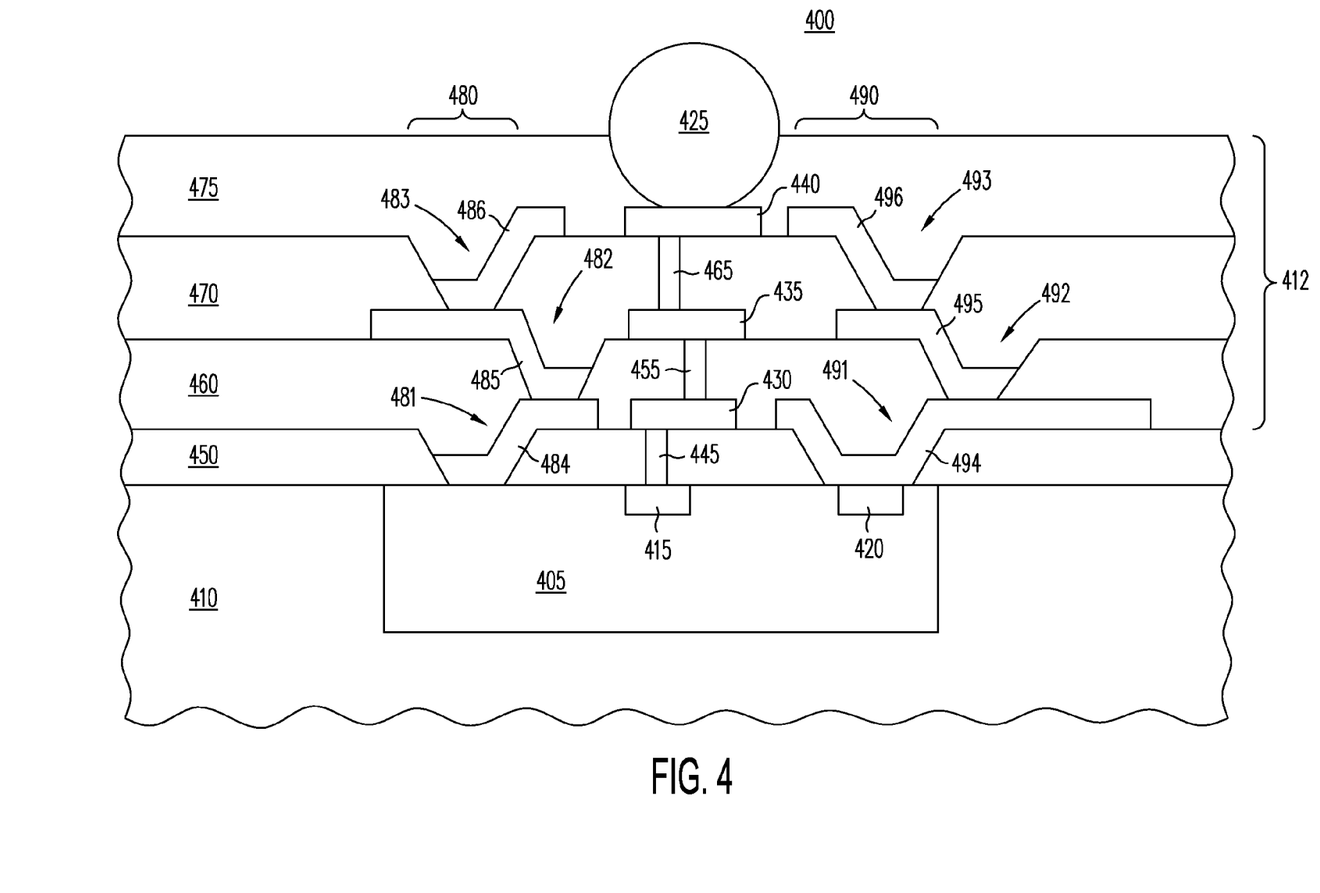
FIG. 4 is a simplified block diagram illustrating a cross-section of a semiconductor device package incorporating embodiments of the present invention.

FIG. 4 is a simplified block diagram illustrating a cross-section of a semiconductor device package 400 incorporating embodiments of the present invention. FIG. 4 illustrates a semiconductor device die 405 encapsulated in a molding compound 410. Semiconductor device package 400 is fabricated as a fan-out wafer level package, wherein interconnect redistribution layers (RDLs) 412 are formed on an exposed active side of the encapsulated device die. As an example, bond pads 415 and 420 are exposed on semiconductor device die 405, and an interconnect couples bond pad 415 to a solder ball 425 on an outer surface of semiconductor device package 400. Solder ball 425 is typically a member of a ball grid array fashioned on the outer surface of the package.

The interconnect coupling the bond pad 415 to solder ball 425 includes a series of portions of metal layers and conductive vias through layers of dielectric built up on the active surface of the die/encapsulant portion of the package. A portion 430 of a first metal layer is electrically coupled to bond pad 415 by a first conductive via 445 formed through first dielectric layer 450. Similarly, a portion 435 of a second metal layer is electrically coupled to portion 430 of the first metal layer by a second conductive via 455 formed through second dielectric layer 460. Again, a portion 440 of a third metal layer is electrically coupled to portion 435 of the second metal layer by a third conductive via 465 formed through third dielectric layer 470. As illustrated, portion 440 of the third metal layer is a contact for solder ball 425, which is available for external coupling through a final dielectric layer 475.

The conductive path from bond pad 415 to solder ball 425 is sensitive to RF noise or electromagnetic interference. Thus, isolating structures 480 and 490 are formed around the conductive path. It is understood that the isolating structures are a portion of a "wall" formed around the conductive path, similar to that illustrated in FIGS. 2A and 2B.

Isolating structure 480 includes a portion formed in a trench via 481 formed in first dielectric layer 450. A trench via is formed by first opening a trench region in the first dielectric layer by using, for example, photolithography or laser ablation techniques. It should be understood that the trench formed is three-dimensional, and extends into the illustrated page and above the illustrated page. This dimensionality can extend the length of the region desired to be electrically isolated, thereby forming one of the walls around the RF/EMI sensitive electrical coupling. The illustrated embodiments provide a slanted cross-sectional profile of the trench via, but in other embodiments the sidewalls of the trenches can have a near vertical profile, especially where a reactive-ion etch or other dry anisotropic etch is used to produce the trench via.

In order to form the portion of isolating structure 480 in dielectric layer 450, the trench via is filled with metal deposited during formation of the first metal layer discussed above. This forms a first metal region 484 that includes a portion along the walls of the trench via. The trench via can be filled with metal to a depth of the thickness of the first metal layer. This vertical depth of metal through the dielectric layer serves to isolate the signal carrying conductive path through the dielectric layer.

A similar process is followed for forming the portion of isolating structure 480 in dielectric layer 460. A trench via 482 is formed in the dielectric layer, wherein the trench via exposes a contact portion of first metal region 484. Once exposed, the contact portion of first metal region 484 can be cleaned of oxides, debris, passivation materials, or other contaminants by use of, for example, a sputter etch. Trench via 482 can then be filled with a metal deposited during formation of the second metal layer discussed above. This forms a second metal region 485 that includes a portion along the walls of the trench via, which is in electrical contact with first metal region 484. And a similar formation process is followed for formation of trench 483 in third dielectric layer 470, which is filled with a third metal portion 486. It should be understood that filled trench vias, in electrical contact with one another, will form the isolating structure through as many redistribution layers as are formed in the package.

Isolating structure 490 is formed in a similar manner to that discussed above for isolating structure 480. Trench vias 491, 492, and 493 are formed in dielectric layers 450, 460, and 470, respectively. Each of trench vias 491, 492, and 493 are filled with metal to form metal regions 494, 495, and 496, respectively, each of which are in electrical contact. One distinction between isolating structure 490 and isolating structure 480 is that isolating structure 490 is electrically coupled to a bond pad 420 on the active surface of semiconductor device die 405. As discussed above, bond pad 420 can be a ground bond pad, thereby grounding isolating structure 490, and any other isolating structures electrically coupled to isolating structure 490. The electrical coupling between metal region 494 and bond pad 420 can be performed in a manner similar to that discussed above with regard to electrically coupling the various metal regions in the isolation regions. That is, forming trench 491 above the bond pad, and then sputter etching the metal of the bond pad to clean the bond pad of contaminants prior to forming metal region 494.

Figure 5:
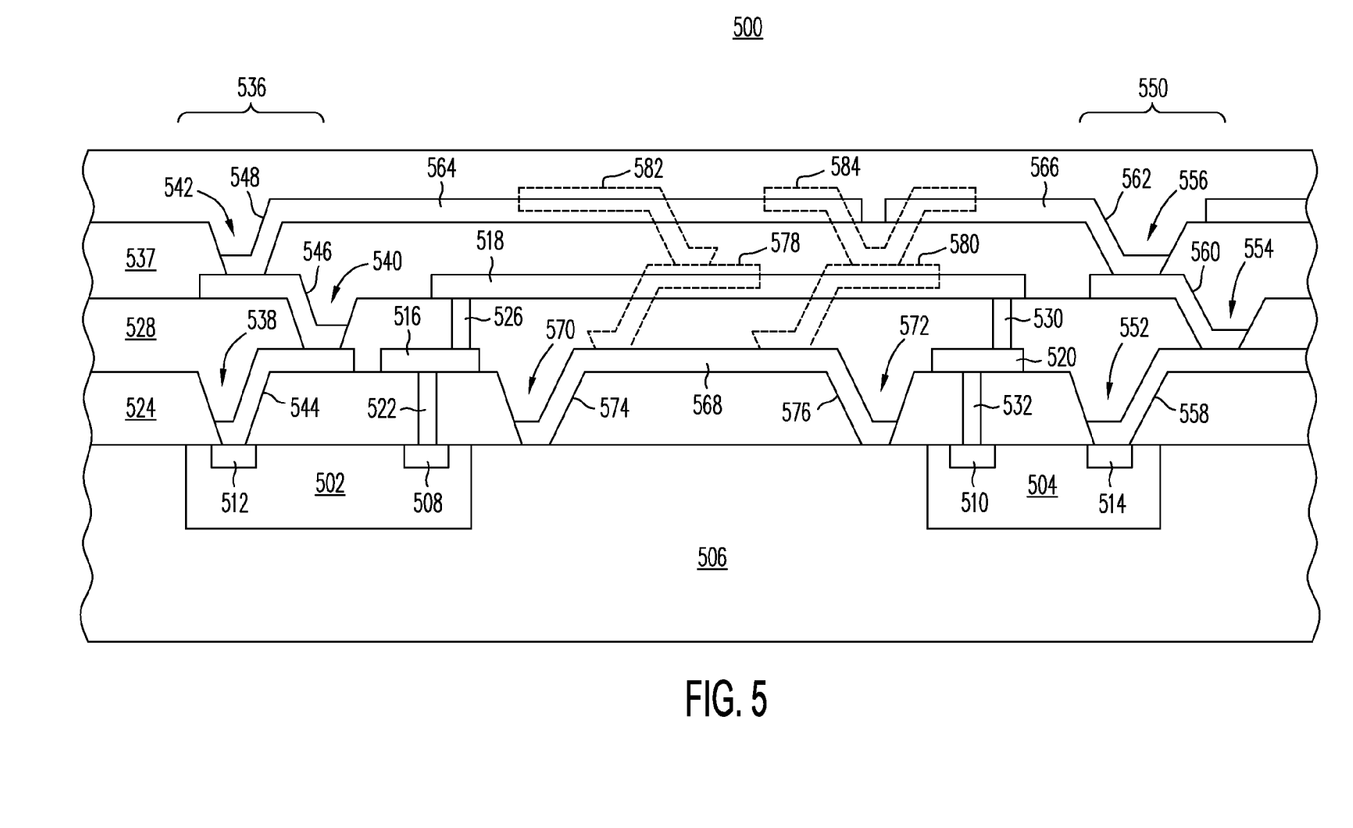
FIG. 5 is a simplified block diagram illustrating a cross-section of a semiconductor device package incorporating embodiments of the present invention.

FIG. 5 is a simplified block diagram illustrating a cross-section of a semiconductor device package 500 incorporating embodiments of the present invention, and specifically illustrating a mechanism to form an electrically isolating tunnel such as that suggested in FIG. 3. Semiconductor device package 500 is fabricated as a fan-out wafer-level package, wherein interconnect redistribution layers are formed on an exposed active side of two encapsulated device die. As illustrated, two semiconductor device die 502 and 504 are encapsulated in a molding compound 506. Bond pads 508 and 512 are exposed on semiconductor device die 502, while bond pads 510 and 514 are exposed on semiconductor device die 504. The interconnect in the redistribution layers serves to couple bond pad 508 of device die 502 with bond pad 510 of device die 504.

The interconnect coupling bond pad 508 with bond pad 510 includes a series of portions of metal layers and conductive vias through layers of dielectric built up on the active surface of the encapsulated dies of the package. A portion 516 of a first metal layer is electrically coupled to bond pad 508 buy a first conductive via 522 formed through first dielectric layer 524. Similarly, a portion 518 of a second metal layer is electrically coupled to portion 516 of the first metal layer by a second conductive via 526 formed through second dielectric layer 528. Portion 518 of the second metal layer runs along a top surface of second dielectric layer 528 to a region of the second device die 504. A portion 520 of the first metal layer is electrically coupled to both portion 518 of the second metal layer and bond pad 510 by a set of conductive vias 530 and 532 passing through the second and first dielectric layers, respectively.

As discussed above with respect to FIG. 3, the signal path provided between bond pad 508 and 510 can be affected by RF noise and EMI. Therefore, it is desirable to provide an isolating wall around the signal passage (e.g, up through the dielectric layers and along the top, bottom, and sides of transverse passage of portion 518). The remaining metal regions illustrated in FIG. 5 are an example of providing such isolation.

On the left side of the figure is an isolation region 536, which rises through the dielectric layers from device die 502 to a third metal layer formed above dielectric layer 537 formed above the second metal layer. As with the embodiment discussed above and illustrated in FIG. 4, the vertical portion of the isolating structure through the dielectric layers is formed using filled trench vias. Trenches 538, 540, and 542 are formed in dielectric layers 524, 528, and 537, respectively. Formation of each of the trenches is performed subsequent to the formation of the dielectric layer in which the trench is formed, and prior to formation of a metal layer above that dielectric layer. The trenches can be formed in the matter discussed above with respect to FIG. 4. Each trench is filled with a respective metal layer, for example, trench 538 is filled with metal region 544 provided during formation of the first metal layer. Metal region 544 is formed in electrical contact with grounding bond pad 512 of device die 502. In a similar manner, trench 540 is filled with metal region 546 that is in electrical contact with metal region 544, and trench 542 is filled with metal region 548 that is in electrical contact with metal region 546. Metal region 548 is a portion of the third metal layer formed above dielectric layer 537. Metal region 548 is also formed to provide a lateral cap 564 over a portion of the signal carrying metal region 518.

On the right side of the figure is an isolation region 550, which rises through the dielectric layers from device die 504 to the third metal layer. As with isolation region 536, the vertical portion of the isolating structure through the dielectric layers is formed using filled trench vias. Again, trenches 552, 554, and 556 are formed in dielectric layers 524, 528, and 537, respectively. Each trench is filled with a respective metal layer, for example, trench 552 is filled with metal region 558 provided during formation of the first metal layer. Metal region 552 is formed in electrical contact with grounding bond pad 514 of device die 504. In a similar manner, trench 554 is filled with metal region 560 that is in electrical contact with metal region 558, and trench 556 is filled with metal region 562 that is in electrical contact with metal region 560. Metal region 562 is a portion of the third metal layer formed above dielectric layer 537. Metal region 562 is also formed to provide a lateral cap 566 over a portion of the signal carrying metal region 518, completing the lateral cap formed over the signal carrier.

An isolating cap in the metal layer beneath lateral signal line 518 is also desirable to protect the line from RF noise and EMI. As illustrated, a metal conductor portion 568 is formed in the first metal layer above dielectric 524. In order to further protect the vertical extents of the signal line, metal conductor portion 568 is coupled to filled trench vias formed in trenches 570 and 572 through dielectric layer 524, using metal portions 574 and 576 formed with the first metal layer is formed. This set of isolating conductors is coupled to a ground (not shown).

In addition to bottom and top isolation, the lateral extent of the signal line should also be isolated along the sides. This can be performed using additional metal portions formed alongside signal line 518 in the second metal layer, and coupled to the other isolating structures using filled trench vias. Examples are illustrated by the dashed line structures in FIG. 5. These structures can be envisioned as placed behind the cross-sectional portion of semiconductor device package 500. Similarly, there are isolating structures placed in front of the cross sectional portion. Metal portions 578 and 580 are formed in the second metal layer and can be electrically coupled to metal conductor potion 568 by filled trench vias, as discussed above. Further, metal portions 582 and 584 can be coupled to metal portions 578 and 580, respectively, also by filled trench vias.

Embodiments of the present invention provide a mechanism for electrically isolating signal carrying structures in redistribution layers of a FO-WLP by using filled trench vias. The filled trench vias provide a thickness of metal that rises vertically through the dielectric layer, thereby creating an isolating wall around the signal carrier. Use of such techniques avoids additional process steps to cap devices and device areas. Instead, the same metal layers used in the RDLs are used to provide the electrical isolation, through use of photolithography and the like. Thus, the solution provided by embodiments of the present invention is more resource efficient and time efficient during production.

By now it should be appreciated that there has been provided a fan-out wafer level semiconductor device package that provides isolation from electromagnetic interference and RF noise within an interconnect of the package. In one embodiment of the present invention, the semiconductor device package includes a semiconductor device die that includes one or more bond pads on an active face of the semiconductor device die, a first set of conductors formed in interconnect layers, and a second set of conductors formed in the interconnect layers. The first set of conductors is coupled to an input/output bond pad of the one or more bond pads. The first set of conductors further transports a signal on a path to or from an end point of the first set of conductors to or from the input/output bond pad. The second set of conductors is coupled to a ground voltage. The second set of conductors is configured to electromagnetically isolate the first set of conductors along the path.

In one aspect of the above embodiment, the second set of conductors includes one or more trench vias formed in corresponding dielectric layers of the interconnect layers. Each trench via is filled with a conductive metal that covers at least a sidewall of the trench via. The conductive metal provides electromagnetic isolation of the first set of conductors through a depth of the corresponding dielectric layer. In another aspect, the second set of conductors includes a plurality of trench vias formed in corresponding layers of the interconnect layers, and a plurality of metal layers each formed above a corresponding dielectric layer, wherein a portion of the metal layers is formed in a trench via formed in the corresponding dielectric layer. In a further aspect, the second set of conductors is configured to electromagnetically isolate the first set of conductors along the path by virtue of being formed around and in proximity to the first set of conductors at each interconnect layer.

In another aspect of the above embodiment, the semiconductor device package further includes a second semiconductor device die the includes one or more bond pads on an active face, which is placed laterally to the semiconductor device die, and a second input/output bond pad of the one or more bond pads of the second semiconductor device die. The second I/O bond pad is coupled to the end point of the first set of conductors, and the path includes a lateral extent between the two semiconductor device die. In a further aspect, the second set of conductors is configured to electromagnetically isolate the first set of conductors along at least a first portion of the lateral extent. In a still further extent, the semiconductor device package further includes a third set of conductors formed in the interconnect layers, coupled to a ground voltage, and configured to electromagnetically isolate the first set of conductors along at least a second portion of the lateral extent. The second portion of the lateral extent is exclusive of the first portion of the lateral extent.

In another aspect of the above embodiment, the semiconductor device package further includes a package connector on an external surface of the semiconductor device package, wherein the package connector is coupled to the end point of the first set of conductors. In a further aspect, the package connector includes a solder ball in a ball grid array disposed on the external surface of the semiconductor device package.

Another embodiment provides a semiconductor device package with interconnect layers, in which the package includes a first set of conductors configured to transport a signal, and a second set of conductors configured to electromagnetically isolate the first set of conductors. The first set of conductors includes a first metal contact formed on a first dielectric layer from a first metal layer, a second metal contact formed on a second dielectric layer from a second metal layer, and a first conductive via coupling the first metal contact to the second metal contact. The second set of conductors includes a plurality of filled trench vias formed in the second dielectric layer, where the plurality of trench vias surrounds the first conductive via.

In one aspect of the above embodiment, a filled trench via includes a trench formed in the second dielectric layer from a top surface of the second dielectric layer to the first metal layer, and a portion of the second metal layer formed in the trench and electrically coupled with a portion of the first metal layer. In a further aspect, the second set of conductors is coupled to ground.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different numbers of device die and signal lines can be provided in the RDL and protected. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device package having interconnect layers, the semiconductor device package comprising:

a semiconductor device die comprising one or more bond pads on an active face of the semiconductor device die;

a first set of conductors formed in the interconnect layers, and coupled to an input/output bond pad that is a member of the one or more bond pads, wherein the first set of conductors is configured to transport a signal on a path to or from an end point of the first set of conductors to or from the input/output bond pad;

a second set of conductors formed in the interconnect layers, and coupled to a ground voltage, wherein
the second set of conductors is configured to electromagnetically isolate the first set of conductors along the path, and
the semiconductor device package is a fan-out wafer level package.

2. The semiconductor device package of claim 1 wherein the second set of conductors comprises:
one or more trench vias formed in corresponding dielectric layers of the interconnect layers, wherein
each trench via is filled with a conductive metal that covers at least a sidewall of the trench via, and
the conductive metal provides electromagnetic isolation of the first set of conductors through a depth of the corresponding dielectric layer.

3. The semiconductor device package of claim 1 wherein the second set of conductors comprises:
a plurality of trench vias formed in corresponding dielectric layers of the interconnect layers;
a plurality of metal layers each formed above a corresponding dielectric layer, wherein a portion of the metal layers is formed in a trench via formed in the corresponding dielectric layer.

4. The semiconductor device package of claim 3 wherein the second set of conductors is configured to electromagnetically isolate the first set of conductors along the path by virtue of being formed around and in proximity to the first set of conductors at each interconnect layer.

5. The semiconductor device package of claim 1 further comprising:
a second semiconductor device die comprising one or more bond pads on an active face of the second semiconductor device die, wherein the second semiconductor device die is placed laterally to the semiconductor device die; and
a second input/output bond pad of the one or more bond pads of the second semiconductor device die, wherein
the second input/output bond pad is coupled to the end point of the first set of conductors, and
the path comprises a lateral extent between the semiconductor device die and the second semiconductor device die.

6. The semiconductor device package of claim 5 wherein the second set of conductors is configured to electromagnetically isolate the first set of conductors along at least a first portion of the lateral extent.

7. The semiconductor device package of claim 6 further comprising:
a third set of conductors formed in the interconnect layers, and coupled to a ground voltage, wherein
the third set of conductors is configured to electromagnetically isolate the first set of conductors along at least a second portion of the lateral extent,
the second portion of the lateral extent is exclusive of the first portion of the lateral extent.

8. The semiconductor device package of claim 1 further comprising a package connector on an external surface of the semiconductor device package, wherein the package connector is coupled to the end point of the first set of conductors.

9. The semiconductor device package of claim 8 wherein the package connector comprises a solder ball in a ball grid array disposed on the external surface of the semiconductor device package.

10. A semiconductor device package having interconnect layers, the semiconductor device package comprising:
a first set of conductors configured to transport a signal, wherein the first set of conductors comprises a first metal contact formed on a first dielectric layer from a first metal layer, a second metal contact formed on a second dielectric layer from a second metal layer, and a first conductive via coupling the first metal contact to the second metal contact;
a second set of conductors configured to electromagnetically isolate the first set of conductors, wherein
the second set of conductors comprises a plurality of filled trench vias formed in the second dielectric layer, and
the plurality of trench vias surrounds the first conductive via.

11. The semiconductor device package of claim 10 wherein a filled trench via of the plurality of filled trench vias comprises:
a trench formed in the second dielectric layer from a top surface of the second dielectric layer to the first metal layer; and
a portion of the second metal layer formed in the trench and electrically coupled with a portion of the first metal layer.

12. The semiconductor device package of claim 11 wherein the second set of conductors is coupled to a ground.

\* \* \* \* \*